(12) United States Patent
Fan

(10) Patent No.: US 10,615,318 B2
(45) Date of Patent: Apr. 7, 2020

(54) QUANTUM DOT LED

(71) Applicant: HUIZHOU CHINA STAR OPTOELECTRONICS TECHNOLOGY CO., LTD., Huizhou Guangdong (CN)

(72) Inventor: Yong Fan, Huizhou Guangdong (CN)

(73) Assignee: HUIZHOU CHINA STAR OPTOELECTRONICS TECHNOLOGY CO., LTD., Huizhou, Guangdong (CN)

( * ) Notice: Subject to any disclaimer, the term of this patent is extended or adjusted under 35 U.S.C. 154(b) by 0 days.

(21) Appl. No.: 16/045,105

(22) Filed: Jul. 25, 2018

(65) Prior Publication Data
US 2019/0245123 A1 Aug. 8, 2019

Related U.S. Application Data

(63) Continuation of application No. PCT/CN2018/080856, filed on Mar. 28, 2018.

(30) Foreign Application Priority Data

Feb. 2, 2018 (CN) .......................... 2018 1 0108405

(51) Int. Cl.
*H01L 33/50* (2010.01)
*H01L 33/48* (2010.01)
(Continued)

(52) U.S. Cl.
CPC .......... *H01L 33/507* (2013.01); *H01L 33/483* (2013.01); *H01L 33/501* (2013.01);
(Continued)

(58) Field of Classification Search
CPC .......... H01L 23/04–057; H01L 33/507; H01L 33/44–58; H01L 27/14685;
(Continued)

(56) References Cited

U.S. PATENT DOCUMENTS

2004/0197527 A1* 10/2004 Maula ............... C23C 16/45525
428/172
2009/0123764 A1* 5/2009 Morita ................... C08G 77/20
428/446
(Continued)

FOREIGN PATENT DOCUMENTS

| CN | 106383420 A | 2/2017 |
| CN | 107565003 A | 1/2018 |

*Primary Examiner* — Charles D Garber
*Assistant Examiner* — Alia Sabur
(74) *Attorney, Agent, or Firm* — Leong C. Lei

(57) ABSTRACT

A quantum dot LED includes a first bracket, an LED chip fixed on the first bracket and connected to the first bracket, and a first inorganic barrier layer located on an upper side of the first bracket, wherein the first inorganic barrier layer encapsulates the LED chip on the first bracket. Wherein a groove is formed on the first inorganic barrier layer, a lens disposed above the first inorganic barrier layer and the first inorganic barrier layer enclose the groove into a closed space, and a silica gel body is disposed within the closed space, and multiple quantum dots are dispersed in the silica gel body. The lens and the inorganic barrier layer form a closed space, and the silica gel body is placed therein to perform water-oxygen isolation of the quantum dots. Meanwhile, the lens can scatter the light and ensure the light-emitting effect of the LED.

15 Claims, 2 Drawing Sheets

(51) Int. Cl.
*H01L 33/60* (2010.01)
*H01L 33/54* (2010.01)
*H01L 33/56* (2010.01)

(52) U.S. Cl.
CPC .............. *H01L 33/54* (2013.01); *H01L 33/60* (2013.01); *H01L 33/56* (2013.01); *H01L 2933/0091* (2013.01)

(58) Field of Classification Search
CPC ......... H01L 21/0228; H01L 2933/0225; H01L 2933/0066; C23C 16/45525–45555; G02B 1/10–11; G02B 1/113–115
See application file for complete search history.

(56) References Cited

U.S. PATENT DOCUMENTS

| | | | | |
|---|---|---|---|---|
| 2011/0210364 A1* | 9/2011 | Nolan | ..................... | H01L 33/44 257/98 |
| 2013/0334557 A1* | 12/2013 | Uchida | ................ | H01L 23/564 257/98 |
| 2014/0246689 A1* | 9/2014 | Luo | ...................... | H01L 33/504 257/98 |
| 2018/0351054 A1* | 12/2018 | Chen | ..................... | H01L 33/507 |

\* cited by examiner

QUANTUM DOT LED

CROSS REFERENCE

This application is a continuing application of PCT Patent Application No. PCT/CN2018/080856, entitled "QUANTUM DOT LED", filed on Mar. 28, 2018, which claims priority to China Patent Application No. CN201810108405.5 filed on Feb. 2, 2018, both of which are hereby incorporated in its entireties by reference.

FIELD OF THE INVENTION

The present invention relates to an LED lighting technology field, and more particularly to a quantum dot LED.

BACKGROUND OF THE INVENTION

Due to the narrow emission peak of the quantum dot LED, the emission wavelength can depend on the size conditions so that the quantum dot LED is widely used in backlight products. However, due to the exposure of quantum dots to a water-oxygen environment, the fluorescence efficiency is irreversibly and rapidly decreased. The encapsulation of the quantum dots requires a good isolation of water and oxygen. The current quantum dot film is composed of PET with a barrier film. To make the quantum dot film have stable optical properties and service life, the oxygen barrier capability of the barrier film needs to be less than 10-1 cc/m^2·day, and the water permeability needs to be less than 10-1 g/m^2·day. In addition, because the quantum dots are sensitive to temperature and when the temperature is increased, the wavelength of the quantum dots will produce a red shift, and the luminous efficiency will also decrease.

As shown in FIG. 1, the conventional LED adopts a metal bracket 11 and a plastic bracket 12. The LED chip 13 is fixed on the metal bracket 11 and is connected with the metal bracket 11 through a gold wire 14. The phosphor and the silica gel 15 are encapsulated on the metal bracket 11 and the plastic bracket 12 with a packaging glue 16. Since the oxygen permeability and the water permeability of the plastic bracket 12 and the packaging glue 16 do not meet the requirements of the working environment of the quantum dot, the thermal conductivity coefficient of the plastic bracket 12 and the packaging glue 16 are lower, resulting in the increase of the quantum dot temperature and the luminous efficiency of the quantum dots is decreased with increasing temperature.

With reference to FIG. 2, the higher the temperature, the worse the water vapor transmission rate (WVTR) of the material, and the operating temperature of the LED is higher, thus raising a higher demand for the barrier property of the material. In order to achieve better barrier properties, it is necessary to adopt a thin film encapsulation to prepare a dense inorganic barrier layer to isolate water and oxygen. Due to the unevenness of the surface of the LED bracket, the use of sputter coating or PECVD may cause uneven thickness and cracking of the film due to unevenness of the surface of the bracket. Therefore, an atomic layer deposition (ALD) is currently used to realize the inorganic barrier layer. When using the ALD to deposit $Al_2O_3$, $ZrO_2$, $TiO_2$, generally $H_2O$ or $O_3$ are injected. $H_2O$ or $O_3$ will destroy the quantum dot at the high temperature (the process temperature is about 80° C.). In addition, the refractive index of $Al_2O_3$, $ZrO_2$, $TiO_2$ is higher (comparing to silica gel for packaging), the light extraction efficiency will be reduced.

SUMMARY OF THE INVENTION

In order to solve the above technology problem, the present invention provides with a quantum dot LED.

The quantum dot LED includes a first bracket; an LED chip fixed on the first bracket and connected to the first bracket; a first inorganic barrier layer located on an upper side of the first bracket, wherein the first inorganic barrier layer encapsulates the LED chip on the first bracket; wherein a groove is formed on the first inorganic barrier layer; wherein a lens disposed above the first inorganic barrier layer and the first inorganic barrier layer enclose the groove into a closed space; and wherein a silica gel body is disposed within the closed space, and multiple quantum dots are dispersed in the silica gel body.

Wherein a second inorganic barrier layer above the lens is provided to encapsulate the lens.

Wherein an organic layer for refracting light is provided on the second inorganic barrier layer.

Wherein the quantum dot LED further includes a second bracket, and the second bracket is disposed around the LED chip and above the first bracket, and the second bracket is encapsulated on the first bracket by the first inorganic barrier layer.

Wherein the first inorganic barrier layer and the second inorganic barrier layer are manufactured by an atomic layer deposition, a thickness of the second inorganic barrier layer is 20 nm to 200 nm.

Wherein the second inorganic barrier layer is a single-layer structure, and a composition material of the single-layer structure includes any one of alumina, zirconia and titanium dioxide.

Wherein the second inorganic barrier layer is a multi-layer structure having multiple layers, and a material of each layer includes any one of alumina, zirconia and titanium dioxide.

Wherein materials of adjacent layers of the second inorganic barrier layer are different.

Wherein the multiple quantum dots includes a red quantum dot and a green quantum dot.

Wherein the multiple quantum dots includes a green quantum dot, and a red fluorescent material is further disposed in the silica gel body.

The present invention has the following beneficial effects:

The lens and the inorganic barrier layer form a closed space, and the silica gel body is placed therein to perform water-oxygen isolation of the quantum dots in the silica gel body. At the same time, the lens can scatter the light and ensure the light-emitting effect of the LED.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

In the present invention, a lens and an inorganic barrier layer are used together to form a closed space, and a silica gel body containing quantum dots is disposed in the closed space. The closed space provides a water-oxygen-isolated environment for the quantum dots in the silica gel body. At the same time, utilizing the lens to scatter the light in order to ensure luminous efficiency. The specific implementation of the system will be further described below with reference to the accompanying drawings and embodiments.

An embodiment of a quantum dot LED provided by the present invention will be described in detail below.

Figure 1:
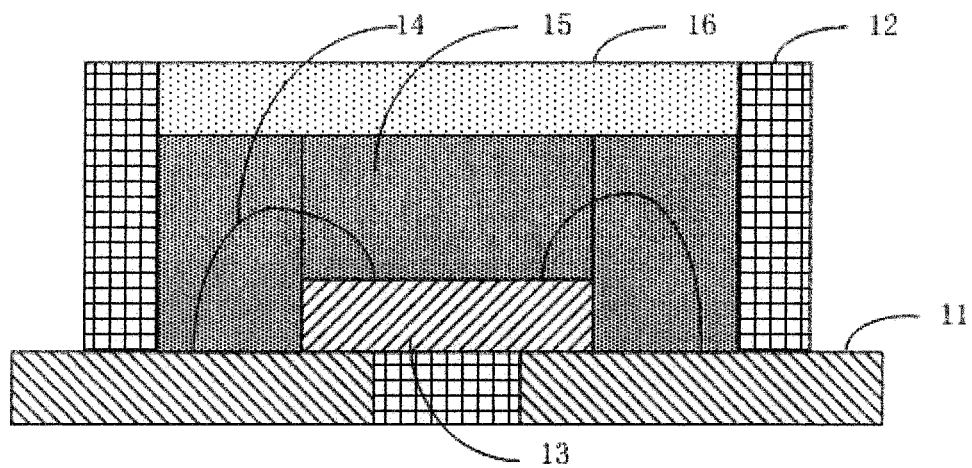
FIG. 1 is a packaging structure diagram of a conventional LED provided by the conventional art.
Figure 2:
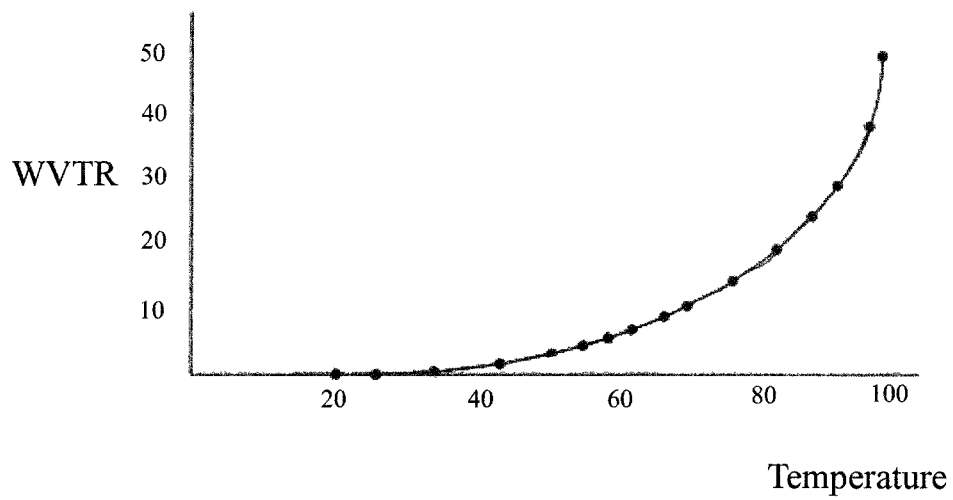
FIG. 2 is a relationship diagram of temperature versus water barrier property provided by the conventional art.
Figure 3:
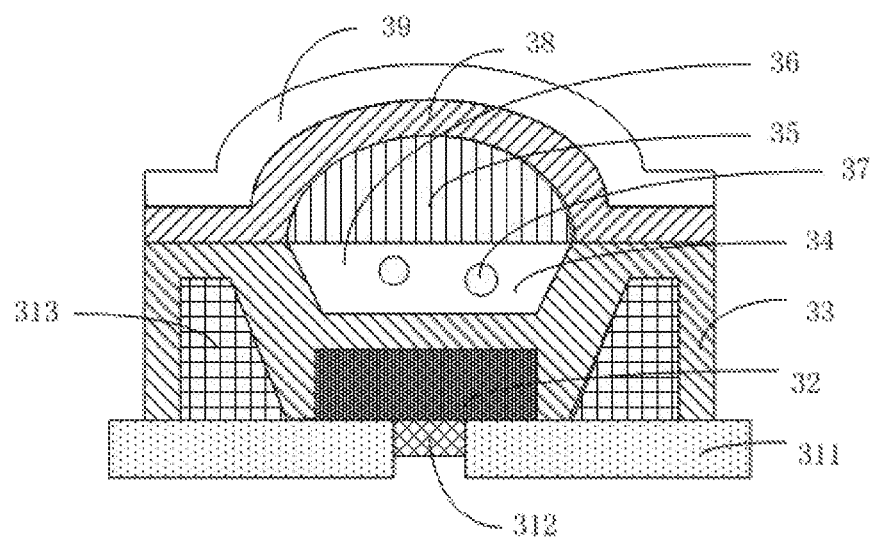
FIG. 3 is a schematic diagram of a quantum dot LED structure provided by the present invention.

In an embodiment of the present invention, as shown in FIG. 3, a quantum dot LED provided by an embodiment of the present invention includes a first bracket 311, an LED chip 32 fixed on the first bracket 311 and connected to the first bracket 311, a first inorganic barrier layer 33 located on an upper side of the first bracket 311, wherein the first inorganic barrier layer 33 encapsulates the LED chip 32 on the first bracket 311. A groove 34 is formed on the first inorganic barrier layer 33. A lens 35 disposed above the first inorganic barrier layer 33 and the first inorganic barrier layer 33 enclose the groove 34 into a closed space; a silica gel body 36 is disposed within the closed space, and multiple quantum dots 37 are dispersed in the silica gel body 36.

In the embodiment of the present invention, the "first" in the first bracket does not represent the sequence, and is only used to distinguish the brackets. Here, the first bracket is made of a metal material and is divided into two parts by a middle plastic material, and an intermediate plastic plate 312 is used for insulating, a portion of the first bracket is connected to an anode of the LED chip 32, and another portion of the first bracket is connected to a cathode of the LED chip 32. Of course, the first bracket here may also adopt a ceramic bracket or a polymer material without using the intermediate plastic plate 312.

A second bracket 313 may be selectively disposed around the LED chip 32 and above the first bracket 311. The second bracket 313 is made of a plastic material, generally an EMC (Epoxy Molding Compound) is used, and the purpose of the second bracket 313 is to prevent a light emitted from the LED chip 32 to irradiate to a side surface. Here, the second bracket 313 is used for reflecting the lateral light, so that the direction of light irradiation is more concentrated and the efficiency is higher. The second bracket 313 is encapsulated on the first bracket 311 by the first inorganic barrier layer 33

The "first" in the first inorganic barrier layer does not represent the sequence, and is used only for identifying the inorganic barrier layer, and distinguishes the second inorganic barrier layer; the purpose of forming the groove on the first inorganic barrier layer is to place the silica gel body, The silica gel body is heated and cured by a silica gel, and the mixed quantum dots in the silica gel are also cured together in the silica gel body.

The purpose of disposing the lens 35 is to scatter the light to achieve a better light transmission effect, but the lens 35 is limited by the material, and the effect of isolating water and oxygen is not particularly good. For the purpose of isolating water and oxygen, the present invention provides with a second inorganic barrier layer 38 above the lens 35 to encapsulate the lens 35. A thickness of the second inorganic barrier layer is 20 nm to 200 nm. If the thickness is too thin, the effect of isolating water and oxygen is not good, and if the thickness is too thick, a refractive index of the light is too high.

In order to reduce a refractive index of light, an organic layer 39 for refracting light is optionally provided in the second inorganic barrier layer 38. The above disposition is an integrated design for balancing water oxygen penetration and light transmission.

For the inorganic barrier layer, using a sputter coating or PECVD will generate a problem that the thickness of the film is uneven and the film layer is easily cracked due to the unevenness of the surface. Therefore, the first inorganic barrier layer and the second inorganic barrier layer are manufactured by an atomic layer deposition.

The second inorganic barrier layer 38 can be a single-layer structure or a multi-layered structure. When the second inorganic barrier layer 38 is a single-layer structure, a composition material of the above single-layer structure includes any one of alumina, zirconia and titanium dioxide; when the second inorganic barrier layer 38 is a multi-layer structure, each layer includes any one of alumina, zirconia and titanium dioxide. In order to achieve a better isolation of the water and oxygen, the multi-layer structure of the second inorganic barrier layer 38 can use different materials in different layers.

According to the light emitting characteristics of quantum dots, the quantum dots include red quantum dots and green quantum dots. Although the luminous efficiency of the quantum dots is high, most of the materials used in quantum dots are heavy metals, which seriously pollute the environment. In order to reduce environmental pollution, red fluorescent materials are generally used to replace the red quantum dots to emit light, so only green quantum dots are used, and red fluorescent materials are further disposed in the silica gel. Red fluorescent materials and green quantum dots are used to ensure the emission efficiency without polluting the environment.

Persons of ordinary skill in the art may understand that all or part of the processes in implementing the methods of the foregoing embodiments may be performed by a computer program to instruct the relevant hardware, and the program may be stored in a computer-readable storage medium. When executing, the flow of the embodiment of each method may be included. The storage medium may be a disk, an optical disk, a Read-Only Memory (ROM) or a Random Access Memory (RAM), etc.

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

What is claimed is:

1. A quantum dot LED, comprising:
   a first bracket;
   an LED chip fixed on the first bracket and connected to the first bracket;
   a first inorganic barrier layer located on an upper side of the first bracket, wherein the first inorganic barrier layer encapsulates the LED chip on the first bracket;
   wherein a groove is formed on the first inorganic barrier layer;
   wherein a lens disposed above the first inorganic barrier layer and the first inorganic barrier layer enclose the groove into a closed space; and
   wherein a silica gel body is disposed within the closed space, and multiple quantum dots are dispersed in the silica gel body;

wherein the groove is formed in the first inorganic barrier layer to have an opening in a top of the first inorganic layer and the opening is closed by the lens such that the closed space is delimited between the lens and the first inorganic barrier layer and the multiple quantum dots disposed in the silica gel body are completely enclosed by the lens and the first inorganic barrier layer.

2. The quantum dot LED according to claim 1, wherein a second inorganic barrier layer above the lens is provided to encapsulate the lens, wherein the second inorganic barrier and the first inorganic barrier layer jointly enclose the lens and the multiple quantum dots disposed in the silica gel body, such that the lens and the multiple quantum dots are completely enclosed by the first and second inorganic barrier layers.

3. The quantum dot LED according to claim 2, wherein an organic layer for refracting light is provided on the second inorganic barrier layer.

4. The quantum dot LED according to claim 2, wherein the quantum dot LED further includes a second bracket, and the second bracket is disposed around the LED chip and above the first bracket, and the second bracket is encapsulated on the first bracket by the first inorganic barrier layer.

5. The quantum dot LED according to claim 3, wherein the quantum dot LED further includes a second bracket, and the second bracket is disposed around the LED chip and above the first bracket, and the second bracket is encapsulated on the first bracket by the first inorganic barrier layer.

6. The quantum dot LED according to claim 2, wherein the first inorganic barrier layer and the second inorganic barrier layer are manufactured by an atomic layer deposition, a thickness of the second inorganic barrier layer is 20 nm to 200 nm.

7. The quantum dot LED according to claim 3, wherein the first inorganic barrier layer and the second inorganic barrier layer are manufactured by an atomic layer deposition, a thickness of the second inorganic barrier layer is 20 nm to 200 nm.

8. The quantum dot LED according to claim 2, wherein the second inorganic barrier layer is a single-layer structure, and a composition material of the single-layer structure includes any one of alumina, zirconia and titanium dioxide.

9. The quantum dot LED according to claim 3, wherein the second inorganic barrier layer is a single-layer structure, and a composition material of the single-layer structure includes any one of alumina, zirconia and titanium dioxide.

10. The quantum dot LED according to claim 2, wherein the second inorganic barrier layer is a multi-layer structure having multiple layers, and a material of each layer includes any one of alumina, zirconia and titanium dioxide.

11. The quantum dot LED according to claim 3, wherein the second inorganic barrier layer is a multi-layer structure having multiple layers, and a material of each layer includes any one of alumina, zirconia and titanium dioxide.

12. The quantum dot LED according to claim 10, wherein materials of adjacent layers of the second inorganic barrier layer are different.

13. The quantum dot LED according to claim 11, wherein materials of adjacent layers of the second inorganic barrier layer are different.

14. The quantum dot LED according to claim 1, wherein the multiple quantum dots include a red quantum dot and a green quantum dot.

15. The quantum dot LED according to claim 1, wherein the multiple quantum dots include a green quantum dot, and a red fluorescent material is further disposed in the silica gel body.

* * * * *